Figure 1:
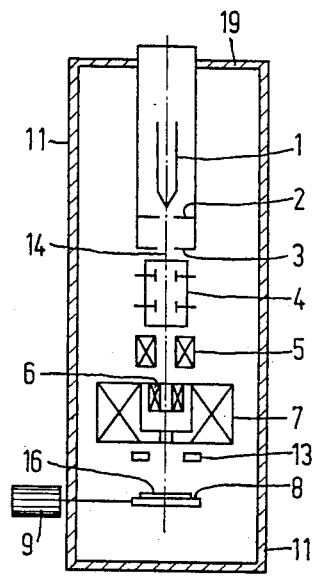

United States Patent [19]

Tolner

[11] Patent Number: 4,798,957
[45] Date of Patent: Jan. 17, 1989

[54] ELECTRON BEAM APPARATUS COMPRISING AN ANODE WHICH IS INCLUDED IN THE CATHODE/WEHNELT UNIT

[75] Inventor: Harm Tolner, Eindhoven, Netherlands

[73] Assignee: U.S. Philips Corporation, New York, N.Y.

[21] Appl. No.: 131,252

[22] Filed: Dec. 7, 1987

Related U.S. Application Data

[63] Continuation of Ser. No. 818,153, Jan. 13, 1986, abandoned.

[30] Foreign Application Priority Data

Mar. 28, 1985 [NL] Netherlands ............... 8500906

[51] Int. Cl.⁴ .................................... H01J 3/14
[52] U.S. Cl. ...................... 250/396 R; 313/237; 313/268
[58] Field of Search .............. 250/396 R; 313/256, 313/268, 292, 336, 282, 237

[56] References Cited

U.S. PATENT DOCUMENTS

| | | | |
|---|---|---|---|
| 2,916,649 | 12/1959 | Levin | 313/292 |
| 3,349,283 | 10/1967 | Krefft | 313/257 |
| 3,359,447 | 12/1967 | Tsuyama et al. | 313/268 |
| 3,601,649 | 8/1971 | Steigerwald | 313/237 |
| 3,652,821 | 3/1972 | Dietrich et al. | 219/121 ES |
| 4,057,746 | 11/1977 | Dumonte | 313/237 |
| 4,396,861 | 8/1983 | Hoffmeister et al. | 313/268 |

Primary Examiner—Bruce C. Anderson
Attorney, Agent, or Firm—Paul R. Miller

[57] ABSTRACT

A cathode (32), a Wehnelt cylinder (2, 36) and an anode (3, 51) are accommodated in an integrated unit in an electron beam apparatus. Extremely accurate positioning of a Wehnelt bore and an anode bore with respect to one another can be achieved in such an assembled unit which is mounted in the apparatus so as to be removable as one unit. An exactly defined distance between the Wehnelt cylinder and the anode can also be adjusted. As a result of the exact mutual positioning, the anode bore can be chosen to be so small that it can also act as a beam aperture so that a smaller electron-optical object as well as a substantial reduction of the mutual electron interaction in the beam is achieved.

10 Claims, 1 Drawing Sheet

ELECTRON BEAM APPARATUS COMPRISING AN ANODE WHICH IS INCLUDED IN THE CATHODE/WEHNELT UNIT

This a continuation of application Ser. No. 818,153 filed Jan. 13, 1986 now abandoned.

The invention relates to an electron beam apparatus comprising a cathode, a Wehnelt cylinder, an anode and an electron-optical system for alignment and modulation of an electron beam to be emitted by the cathode.

Such an electron beam apparatus is known in the form of an electron microscope from Philips Technical Review, Vol. 29, 1968, pp. 370–386. In an apparatus described therein a filament or cathode and a Wehnelt cylinder are combined as usual so as to form one unit which is mounted in the apparatus so as to be removable as a single unit. When a comparatively small emissive cathode surface area is realized, an electron spot having small transverse dimensions can be formed in the apparatus. The Wehnelt cylinder which is mounted near the cathode comprises an aperture wherethrough an electron beam to be emitted by the cathode enters the electron-optical system of the apparatus. A customary voltage difference of at the most a few hundreds of volts prevails between the Wehnelt cylinder and the cathode during operation. From a mechanical as well as an electrical point of view, an anode of the described apparatus is fully integral with the electron-optical system and is mounted in the apparatus so as to be separately removable. The anode usually carriers a potential which deviates at least a few kV from that of the Wehnelt cylinder. Therefore, the anode should be mounted, so as to be suitably electrically insulated from the cathode/Wehnelt cyinder unit.

Even though good results have been obtained by means of the known construction, problems are encountered in view of the increasingly more severe requirements imposed on the alignment of the cathode/Wehnelt cylinder unit (also referred to as an electron gun) and the anode with respect to one another.

It is the object of the invention to mitigate this drawback. To achieve this, an electron beam apparatus of the kind set forth in accordance with the invention is characterized in that the anode and the Wehnelt cylinder are positioned with respect to one another by mounting the anode in a support which is rigidly connected to a Wehnelt cylinder support by an insulating intermediate piece.

Because the anode in accordance with the invention forms one, mechanically rigid unit together with the cathode/Wehnelt cylinder unit, a very high accuracy can be achieved relative to the positioning of the grid bore and the anode bore with respect to one another, and an exactly defined distance can be realized between the Wehnelt cylinder and the anode.

For a given potential difference to be used between the Wehnelt cylinder and the anode in a preferred embodiment, the anode can be positioned at such a distance from the Wehnelt cylinder that a cross-over, to be formed by the electron beam, is situated at least substantially in the plane of the anode bore. Notably due to the exact positioning of the Wehnelt cylinder and the anode with respect to one another the anode bore can be chosen to be smaller than the expected cross-section of the cross-over at this area. Consequently, only the electrons of the beam which extend best in the axial direction will be conducted, so that an electron beam with reduced cross-section and current occurs in image-formation or spot-shaping can be realized in the electron-optical system. The degree of beam stopping can be chosen at will so that the beam can be optimized. In the case of comparatively extensive beam stopping where a substantial part of the electron beam emission current is intercepted, electron-optically a smaller spot is realized while at the same time energy spread and brightness reduction due to the interaction of the electrons in the electron-optical system after the anode stop are reduced. The possible effects thereof on the quality of beam shaping are described in "Advances in Electronics and Electron Physics", 1983, Suppln. 13C, Rose et al. pp 524–525 and Optik, 1983, No. 3, pp. 179–207.

In a further preferred embodiment the beam-stopping aperture is arranged at a distance from the plane of the cross-over so that is has no effect thereon. However the total current is thus advantageously reduced, and because the aperture is now situated in a substantially field-free space, requirements imposed regarding orientation will be less severe.

Figure 2:
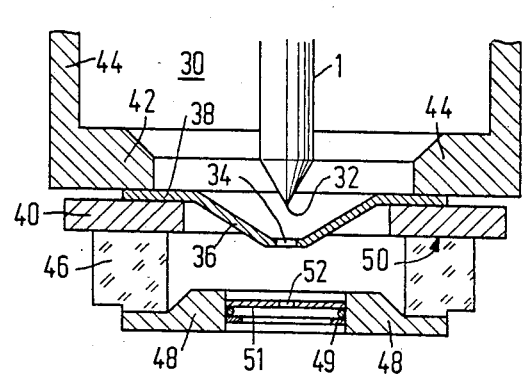
Figure 3:
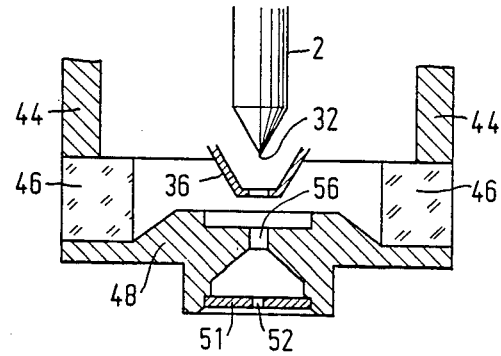

Some embodiments in accordance with the invention will be described in detail hereinafter with reference to the accompanying drawing; therein:

FIG. 1 shows an electron microscope comprising a Wehnelt cylinder/anode unit in accordance with the invention, and FIGS. 2 and 3 show embodiments of a Wehnelt cylinder/anode unit for such an electron microscope.

An electron microscope as shown in FIG. 1 comprises a cathode or filament 1, a Wehnelt cylinder electrode 2, an anode 3, a beam blanking device 4, a beam scanning system 5, a beam alignment system 6 a final lens 7 and a specimen stage 8 with a specimen adjustment device 9. All of these elements are accomodated in a housing 11 which also includes a detection system 13. With an electron beam 14, emitted by the cathode, a specimen 16 arranged on the specimen carrier can be irradiated and radiation due to interaction with the specimen can be detected. In a scanning electron microscope the specimen is scanned by the electron beam and transmitted, reflected and/or secondary electrons, or other radiation generated by interaction between the electron beam and the object, can be detected by the detector system 13 to which a television monitor, not shown in the drawing, is connected.

As appears in FIG. 1, the anode is structurally integral with the cathode/Wehnelt cylinder unit so that the anode can be very accurately positioned with respect to the cathode/Wehnelt cylinder unit in the radial as well as in the axial direction.

FIG. 2 shows an embodiment for an electron gun comprising an integrated anode. Therein, the filament 1 with an emissive spot 32 and the Wehnelt cylinder 2 with a Wehnelt aperture 34 are accomodated in a bushing 30 in a customary manner. The Wehnelt cylinder is now formed as a cup-shaped foil 36 having an outer edge 38 clamped between two bushings 40 and 42 which form part of the bushing 30. By a wall portion 44 of the bushing 42, the Wehnelt cylinder can be mounted on a plate 19 of the electron beam apparatus. On the bushing 40, in this case shaped as a flat ring, an anode holder 48 is mounted by means of an electrically insulating intermediate piece 46. The intermediate piece 46 is, for example, a ceramic ring having an end face 50 where the bushing 40 is connected, for example, by means of a heat-resistant bonding technique, and where the preferably metal anode holder 48 is secured on an oppositely situated end face in a similar manner. An integrated Wehnelt cylinder/anode unit is thus realized in conjunction with the cathode/Wehnelt cylinder unit. An anode plate 51 comprising an anode bore 52 is mounted in the anode holder 48 by means of a clamping device 49.

This construction allows for extremely exact positioning of the Wehnelt cylinder bore 34 and the anode bore 52 with respect to one another. Both bores will usually be spherical and oriented so as to be concentric with the optical axis. To this end, the Wehnelt bore has a diameter of, for example approximately 0.5 mm. The anode bore can be adapted to the relevant requirements and has a diameter of, for example, from 10 to 250 μm. This method of mounting results in a suitable breakdown-resistant anode construction, while any problems due to creepage leaks can be eliminated, if necessary, by re-arranging electrical creepage paths by the provision of additional recesses in the insulating bush 46.

In addition to achieving optimum mutual adjustment of the Wehnelt cylinder bore and the anode bore, the integrated construction is also extremely suitable for achieving comparatively small, well-defined distances between the anode plate 51 and a grid plate (not shown). Notably in apparatus, for measurements on insulating surfaces, such as specimens for integrated circuits and the like where comparatively low anode voltages are used, a small but well-defined Wehnelt cylinder/anode distance is very important in order to obtain a high brightness. This construction allows for distances of less than 2.5 mm, and preferably less than 1 mm. When a more pronounced cup shape is imparted to the Wehnelt cylinder or the anode plate, the length of the intermediate piece 46 may still remain comparatively large, so that the occurence of electrical creepage leaks is still avoided.

Because the mutual adjustment can now be so accurately performed and the bores can be aligned with respect to one another with a tolerance of less than 10 μm, use can now be made of an anode bore which also serves as a beam aperture. Edge rays of the beam can be intercepted by such an aperture bore so that the (virtual) object for the electron beam is electron-optically enhanced. When the anode aperture also functions as beamstop the beam reduction after the anode results in a strong reduction of mutual interactions of the electrons in the beam as well in the travelling direction as in a direction in the cross-section of the beam. Thus the negative influence of the Boersch effect and beam spread is strongly reduced resulting in a chromatic beam with a high brightness.

In an embodiment as shown in FIG. 3 the anode is constructed to be double and comprises, in addition to the already described anode plate 51 with the anode bore 52, a second anode bushing 54 with an aperture 56 which may be comparatively larger with respect to the anode bore 52 and which does not serve as an aperture but solely as an electron lens. The first anode bore 52 can now perform or combine each of the functions. For a pierce-like gun, i.e., an electron gun in which no crossover occurs, the first anode bore can act as an aperture. This aperture will definitely intercept the edge rays, so that the described advantages are achieved again. The exact positioning of the Wehnelt cylinder bore and the anode bore or anode bores also offers a better possibility for the use of non-rotationally symmetrical bores, for example elliptical bores. Electron-optical advantages can thus be achieved, for example, as described in the article "Advances in Electronics and El. Ph.", but it is also possible, for example, to form an elongated beam spot which may be advantageous in scanning or writing apparatus. By a suitable choice of the geometry of each of the bores and their orientation with respect to one another, the beam shaping in the apparatus can be optimized, and a beam spot having the desired geometry can be formed, etc. When use is made of different anode bores, it may be advantageous to form these bores in anode plates which can be mounted so as to be removable. Upon removal, exact mutual positioning will be required, for which purpose the construction can then be provided with the necessary elements. However, the invention also concerns the provision of a series of standard Wehnelt cylinder/anode units, preferably with an integrated cathode, for different shapes of the Wehnelt cylinder and the anode and different mutual positions.

What is claimed is:

1. An electron beam apparatus comprising
   cathode means for emitting an electron beam,
   a Wehnelt cylinder electrode having an aperture for passing said electron beam,
   wherein said cathode means and said Wehnelt cylinder electrode are disposed together as a separate unitary structure within the electron beam apparatus to pass said electron beam in a direction parallel to the longitudinal axis of the electron beam apparatus,
   anode means for shaping said electron beam, said anode means including an anode holder and at least one anode plate having an anode bore, said anode bore providing a beam aperture for said electron beam, wherein said anode means operates with an anode voltage of at most 5 KV,
   electrically insulating structural means between said anode means and said unitary structure for mounting said anode means integrally and rigidly to said unitary structure to form a composite structure of said cathode means, said Wehnelt cylinder electrode, and said anode means in said direction parallel to the longitudinal axis of the electron beam apparatus, wherein said electrically insulating structural means is a cylindrical structure,
   and wherein said electrically insulating structural means is a ceramic ring, and
   electron-optical means for aligning and modulating said electron beam.

2. An electron beam apparatus according to claim 1, wherein said anode plate has a cup-shaped structure facing said Wehnelt cylinder electrode.

3. An electron beam apparatus according to claim 2, wherein said Wehnelt cylinder electrode has a cup-shaped structure facing said anode means.

4. An electron beam apparatus according to claim 3, wherein said electrically insulating structural means separates said Wehnelt cylinder electrode from said anode plate by a distance of less than 2.5 mm.

5. An electron beam apparatus according to claim 4, wherein said distance is less than 1 mm.

6. An electron beam apparatus according to claim 1, wherein said anode bore has a diameter from 10 to 250 mm for strongly reducing mutual electron interaction in said electron beam after passing said anode bore.

7. An electron beam apparatus according to claim 12, wherein said anode means includes a second anode bore separated from said anode bore.

8. An electron beam apparatus according to claim 7, wherein said anode bore has a diameter from 10 to 250 mm for strongly reducing mutual electron interaction in said electron beam after passing said anode bore.

9. An electron beam apparatus according to claim 1, wherein said anode plate is removable to be exchanged for at least another anode plate having a different anode bore.

10. An electron beam apparatus according to claim 9, wherein said anode bore has a diameter from 10 to 250 mm for strongly reducing mutual electron interaction in said electron beam after passing said anode bore.

* * * * *